US009960221B2

(12) United States Patent
Kim

(10) Patent No.: US 9,960,221 B2
(45) Date of Patent: May 1, 2018

(54) ORGANIC LIGHT EMITTING DIODE DISPLAY AND MANUFACTURING METHOD THEREOF

(71) Applicant: Samsung Display Co., Ltd., Yongin-si, Gyeonggi-do (KR)

(72) Inventor: Tae Uk Kim, Seoul (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days. days.

(21) Appl. No.: 15/044,675

(22) Filed: Feb. 16, 2016

(65) Prior Publication Data

US 2016/0322448 A1 Nov. 3, 2016

(30) Foreign Application Priority Data

Apr. 29, 2015 (KR) .................... 10-2015-0060539

(51) Int. Cl.
*H01L 29/66* (2006.01)
*H01L 29/786* (2006.01)
*H01L 27/32* (2006.01)
*H01L 29/24* (2006.01)

(52) U.S. Cl.
CPC ...... *H01L 27/3265* (2013.01); *H01L 27/3248* (2013.01); *H01L 27/3262* (2013.01); *H01L 27/3276* (2013.01); *H01L 29/24* (2013.01); *H01L 29/66757* (2013.01); *H01L 29/7869* (2013.01); *H01L 29/78675* (2013.01)

(58) Field of Classification Search
CPC ............... H01L 29/24; H01L 29/66757; H01L 29/78675; H01L 29/7869; H01L 27/3276; H01L 27/3262; H01L 27/3265; H01L 27/3248
See application file for complete search history.

(56) References Cited

U.S. PATENT DOCUMENTS

2008/0121872 A1* 5/2008 Choi .................... H01L 27/1229
257/40
2014/0070184 A1* 3/2014 Shin ................... H05B 33/0803
257/40

FOREIGN PATENT DOCUMENTS

KR 10-2003-0058195 A 7/2003
KR 10-2012-0039947 A 4/2012
(Continued)

*Primary Examiner* — Marcos D Pizarro Crespo
*Assistant Examiner* — Benjamin Tzu-Hung Liu
(74) *Attorney, Agent, or Firm* — Knobbe Martens Olson & Bear LLP

(57) ABSTRACT

An organic light emitting diode display includes: a substrate; a scan line formed over the substrate and transmitting a scan signal; a data line crossing the scan line and transmitting a data voltage; a driving voltage line crossing the scan line and transmitting a driving voltage; a switching transistor connected to the scan line and the data line; a driving transistor connected to the switching transistor; a driving connection member connected to a driving gate electrode of the driving transistor; a storage capacitor including a first storage electrode and a second storage electrode; a pixel electrode electrically connected to the driving transistor; and a contact hole connecting the first storage electrode and the driving connection member. the second storage electrode may include a cut-out by a curved edge at least partially surrounding the contact hole, and the pixel electrode may be formed not to overlap the cut-out.

14 Claims, 11 Drawing Sheets

(56) References Cited

FOREIGN PATENT DOCUMENTS

KR  10-2014-0112741 A   9/2014
KR  10-2014-0127781 A   11/2014

\* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2015-0060539 filed in the Korean Intellectual Property Office on Apr. 29, 2015, the entire contents of which are incorporated herein by reference.

BACKGROUND

(a) Field

The present disclosure relates to an organic light emitting diode display and a manufacturing method thereof.

(b) Discussion of the Related Technology

Recently, typical display devices have been replaced with portable thin flat panel displays. Among flat panel displays, an organic light emitting diode display has recently been highlighted as a self-emission display device and a next generation display device with virtues such as a wide viewing angle, outstanding contrast, and a fast response time.

The organic light emitting diode display includes an intermediate layer, a first electrode, and a second electrode. The intermediate layer includes an organic light emission layer, and when a predetermined voltage is applied to the first electrode and the second electrode, visible rays are generated from the organic light emission layer.

Further, the organic light emitting diode display may be manufactured by using a thin film transistor substrate provided with one or more thin film transistors. The thin film transistor substrate includes one or more capacitors so that various electrical characteristics may be implemented other than the thin film transistors.

The above information disclosed in this Background section is only to enhance the understanding of the background of the invention and therefore it may contain information that does not form the prior art that is already known in this country to a person of ordinary skill in the art.

SUMMARY

An aspect of the present invention provides an organic light emitting diode display and a manufacturing method thereof that is capable of improving electrical characteristics.

One aspect of the invention provides an organic light emitting diode display device, which may comprise: a substrate; a scan line formed over the substrate and configured to transmit a scan signal; a data line crossing the scan line when viewed in a viewing direction perpendicular to a major surface of the substrate and configured to transmit a data voltage; a driving voltage line crossing the scan line when viewed in the viewing direction and configured to transmit a driving voltage; a switching transistor connected to the scan line and the data line; a driving transistor connected to the switching transistor; a driving connector member connected to a driving gate electrode of the driving transistor; a storage capacitor comprises a first storage electrode and a second storage electrode; a pixel electrode electrically connected to the driving transistor; and a contact hole connecting the first storage electrode and the driving connector member, wherein, when viewed in the viewing direction, the second storage electrode comprises a curved edge at least partly surrounding the contact hole, and wherein the pixel electrode is formed not to overlap the curved edge when viewed in the viewing direction.

In the foregoing device, the first storage electrode may correspond to the driving gate electrode, and wherein the second storage electrode may be formed by expanding from the driving voltage line. The curved edge may comprise a first portion that is parallel to the data line and a second portion that is parallel to the scan line. The device may further comprises a light emission control line formed over the substrate and configured to transmit a light emission control signal; and a light emission control transistor connected to the driving transistor. The light emission control transistor may comprise a light emission channel, a light emission gate electrode, a light emission source electrode, and a light emission drain electrode. The device may further comprise a light emission connector member electrically connected to the light emission drain electrode, wherein the pixel electrode is electrically connected to the light emission connector member. The pixel electrode may overlap another contact hole electrically connected to the light emission connecting member, and have a generally polygonal shape.

Still in the foregoing device, the device may further comprise: an organic light emission layer formed over the pixel electrode, and a common electrode formed over the organic light emission layer. The device may further comprise an initialization voltage line formed in the same layer as the pixel electrode and configured to transmit an initialization voltage initializing the driving transistor. The first storage electrode and the driving gate electrode may be integrated in a single piece which overlaps the second storage electrode. The second storage electrode may extend from the driving voltage line and is formed of a material the same as that of the driving voltage line. An edge of the driving voltage line and the curved edge of the second storage electrode may collectively define an indent. The pixel electrode may overlap the second storage electrode, but does not overlap the indent when viewed in the viewing direction. The device may further comprise a light emission layer, wherein the light emission layer overlaps the second storage electrode, but does not overlap the indent when viewed in the viewing direction. The device comprises a plurality of pixels and a plurality of pixel driving circuits, each of which is connected to one of the plurality of pixels, wherein each pixel driving circuit comprises the switching transistor, the driving transistor, the driving connector member and the storage capacitor.

Another aspect of the invention provides a method of making an organic light emitting diode display, which may comprise: forming a semiconductor layer over a substrate; forming a first insulation layer over the semiconductor layer; forming a first electrically conductive layer portion over the first insulation layer, thereby forming a first thin film transistor comprising the semiconductor layer and the electrically conductive layer portion which is configured to function as a gate electrode; forming a second insulation layer over the first electrically conductive layer portion; forming a second electrically conductive layer portion over the second insulation layer, wherein the first and second electrically conductive layer portions overlap each other, thereby forming a capacitor, wherein the first electrically conductive layer portion comprises a first capacitor electrode of the capacitor, wherein the second electrically conductive layer portion comprises a second capacitor electrode of the capacitor; forming a third electrically conductive layer portion over the second insulation layer; forming a via connecting the third electrically conductive layer portion and the first electrically conductive layer portion; forming a third insulation layer over the second and third electrically conductive layer portions; and forming a pixel electrode over the third insulation layer, wherein the second electrically conductive layer portion comprises a cut-out defined by a curved edge thereof which at least partly surrounds the via when viewed in a viewing direction perpendicular to a major surface of the substrate, wherein the pixel electrode does not overlap the cut-out when viewed in the viewing direction.

In the foregoing method, the cut-out may be an indent or a hole when viewed in the viewing direction. The pixel electrode may overlap the second electrically conductive layer portion, but does not overlap the cut-out when viewed in the viewing direction. The method may further comprise forming a light emission layer over the pixel electrode, wherein the light emission layer overlaps the second electrically conductive layer portion, but does not overlap the cut-out when viewed in the viewing direction. Forming the second electrically conductive layer may comprise patterning an electrically conductive material layer formed over the second insulation layer to form the indent to form the cut-out.

An embodiment of the present invention provides an organic light emitting diode display including: a substrate; a scan line formed on the substrate and configured to transmit a scan signal; a data line crossing the scan line and configured to transmit a data voltage; a driving voltage line crossing the scan line and configured to transmit a driving voltage; a switching transistor connected to the scan line and the data line; a driving transistor connected to the switching transistor; a driving connection member connected to a driving gate electrode of the driving transistor; a storage capacitor configured to include a first storage electrode and a second storage electrode; a pixel electrode electrically connected to the driving transistor; and a contact hole configured to connect the first storage electrode and the driving connection member, wherein the second storage electrode may include a curved portion surrounding the contact hole, and the pixel electrode may be formed not to overlap the curved portion.

The first storage electrode may correspond to the driving gate electrode, and the second storage electrode may be formed by expanding from the driving voltage line.

The curved portion may be disposed at an edge of the second storage electrode, and may include a portion that is parallel to the data line and a portion that is parallel to the scan line.

The organic light emitting diode display may further include a light emission control line formed on the substrate and configured to transmit a light emission control signal, and a light emission control transistor connected to the driving transistor.

The light emission control transistor may include a light emission channel, a light emission gate electrode, a light emission source electrode, and a light emission drain electrode.

The organic light emitting diode display may further include a light emission connecting member electrically connected to the light emission drain electrode, wherein the pixel electrode may be electrically connected to the light emission connecting member.

The pixel electrode may overlap a contact hole electrically connected to the light emission connecting member, and it may be formed to have an overall polygonal shape.

The organic light emitting diode display may further include an organic light emission layer formed on the pixel electrode and a common electrode formed on the organic light emission layer.

The organic light emitting diode display may further include an initialization voltage line formed in the same layer as the pixel electrode and configured to transmit an initialization voltage initializing the driving transistor.

According to the embodiment of the present invention, it is possible to improve electrical characteristics and display quality of an organic light emitting diode display.

DETAILED DESCRIPTION OF EMBODIMENTS

Figure 1:
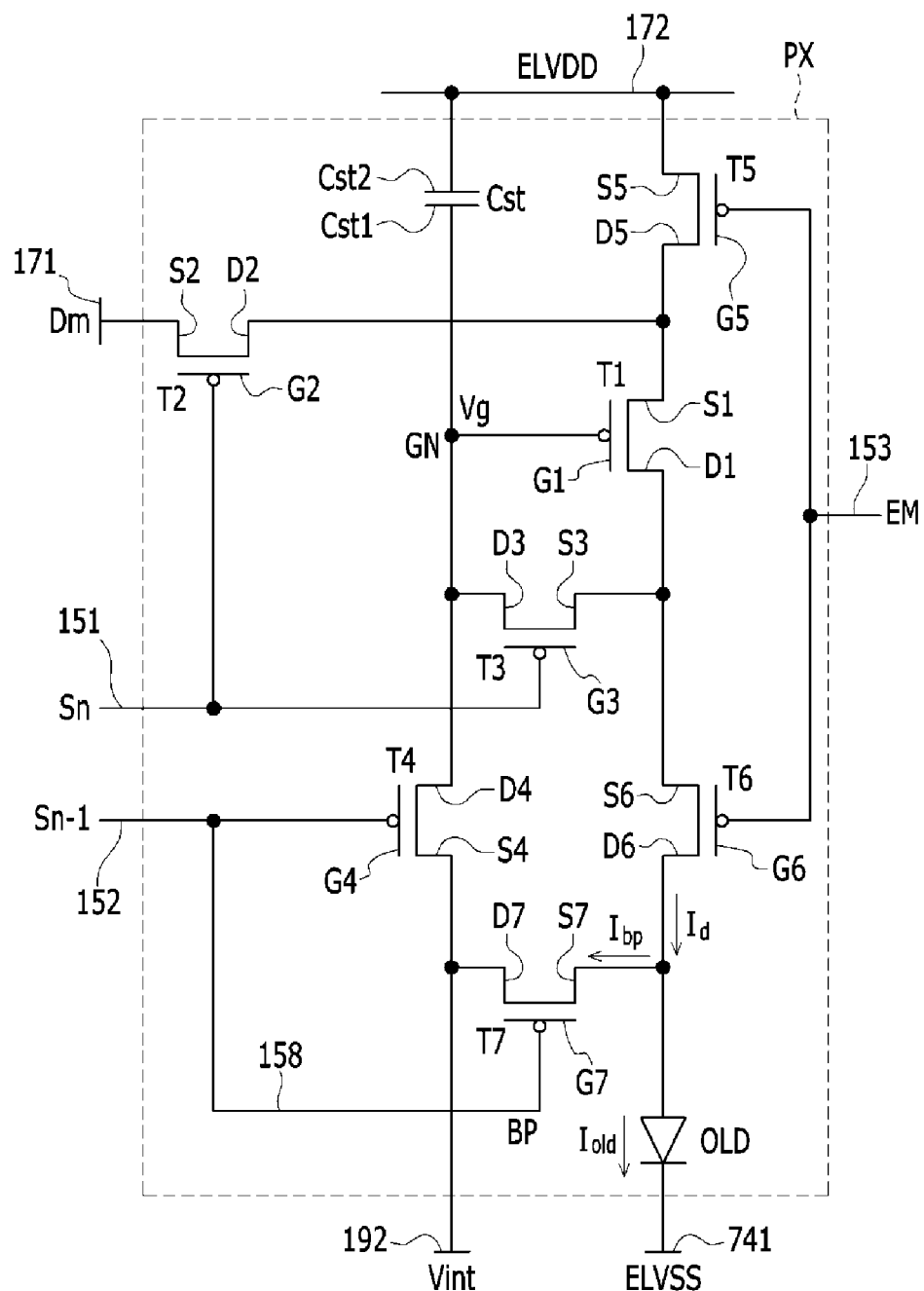
FIG. 1 is an equivalent circuit diagram of one pixel of an organic light emitting diode display according to an embodiment of the present invention.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the present disclosure, when a line is referred to "cross" another line, the line can touch the other line or the line overlaps the other line when viewed in a viewing direction without touching the other line.

Further, the present invention is not limited to the number of the thin film transistors (TFTs) and capacitors of the organic light emitting diode display shown in the accompanying drawings, and one pixel of the organic light emitting diode display may be provided with a plurality of transistors and at least one capacitor, and may be formed to have various structures by further forming additional wires or omitting existing wires. In this case, the pixel is a minimum unit for displaying an image, and the organic light emitting diode display displays the image through a plurality of pixels.

Generally, an organic light emitting diode display may be manufactured by using a thin film transistor substrate provided with one or more thin film transistors. The thin film transistor substrate includes one or more capacitors so that various electrical characteristics may be implemented. However, when particles or other foreign matters enter into the capacitors, or when the electrode thickness is non-uniformly formed due to an etching imbalance, a short-circuit may occur in the capacitors, thereby deteriorating electrical characteristics of the thin film transistor substrate.

An organic light emitting diode display according to an embodiment of the present invention will now be described in detail with reference to the accompanying drawings.

FIG. 1 is an equivalent circuit diagram of one pixel of an organic light emitting diode display according to an embodiment of the present invention.

As shown in FIG. 1, an organic light emitting diode display according to an embodiment of the present invention includes a plurality of signal lines (151, 152, 153, 158, 171, 172, 192), and a plurality of pixels PX connected to the plurality of signal lines and substantially arranged in a matrix form.

One pixel PX of the organic light emitting diode display includes a plurality of transistors (T1, T2, T3, T4, T5, T6, T7) connected to the plurality of signal lines (151, 152, 153, 158, 171, 172, 192), a storage capacitor Cst, and an organic light emitting diode OLD.

In embodiments, the transistors (T1, T2, T3, T4, T5, T6, T7) include a driving transistor T1, a switching transistor T2, a compensation transistor T3, an initialization transistor T4, an operation control transistor T5, a light emission control transistor T6, and a bypass transistor T7.

In embodiments, the signal lines (151, 152, 153, 158, 171, 172, 192) include a scan line 151 transmitting a scan signal Sn, a previous scan line 152 transmitting a previous scan signal Sn−1 to the initialization transistor T4, a light emission control line 153 transmitting a light emission control signal EM to the operation control transistor T5 and the light emission control transistor T6, a bypass control line 158 transmitting a bypass signal BP to the bypass control transistor T7, a data line 171 crossing the scan line 151 and transmitting a data signal Dm, a driving voltage line 172 transmitting a driving voltage (ELVDD) and substantially formed parallel to the data line 171, and an initialization voltage line 192 transmitting an initialization voltage Vint that initializes the driving transistor T1.

In the illustrated embodiment, a gate electrode G1 of the driving thin film transistor T1 is connected to one end Cst1 of the storage capacitor Cst, a source electrode S1 of the driving thin film transistor T1 is connected to the driving voltage line 172 via the operation control thin film transistor T5, a drain electrode D1 of the driving thin film transistor T1 is electrically connected to an anode of the organic light emitting diode OLD via the light emission control transistor T6. The driving thin film transistor T1 receives the data signal Dm according to a switching operation of the switching thin film transistor T2 to supply a driving current 1$d$ to the organic light emitting diode OLD.

In the illustrated embodiment, a gate electrode G2 of the switching thin film transistor T2 is connected to the scan line 151, a source electrode S2 of the switching thin film transistor T2 is connected to the data line 171, and a drain electrode D2 of the switching thin film transistor T2 is connected to the source electrode S1 of the driving thin film transistor T1 and connected to the driving voltage line 172 via the operation control transistor T5. The switching thin film transistor T2 is turned on according to the scan signal Sn received through the scan line 151 to perform a switching operation that transmits the data signal Dm transmitted to the data line 171 to the source electrode S1 of the driving thin film transistor T1.

In the illustrated embodiment, a gate electrode G3 of the compensation transistor T3 is connected to the scan line 151, a source electrode S3 of the compensation transistor T3 is connected to the drain electrode D1 of the driving thin film transistor T1 and is simultaneously connected to an anode of the organic light emitting diode OLD via the light emission control transistor T6, and a drain electrode D3 of the compensation transistor T3 is connected to the drain electrode D4 of the initialization transistor T4, one end Cst1 of the storage capacitor Cst, and the gate electrode G1 of the driving thin film transistor T1. The compensation transistor T3 is turned on according to the scan signal Sn received through the scan line 151 in order to connect the gate electrode G1 and the drain electrode D1 of the driving thin film transistor T1 and to diode-connect the driving thin film transistor T1.

In the illustrated embodiment, a gate electrode G4 of the initialization transistor T4 is connected to the previous scan line 152, a source electrode S4 of the initialization transistor T4 is connected to the initialization voltage line 192, and a drain electrode D4 of the initialization transistor T4 is connected to one end Cst1 of the storage capacitor Cst and the gate electrode G1 of the driving thin film transistor T1 via the drain electrode D3 of the compensation transistor T3. The initialization transistor T4 is turned on according to the previous scan signal Sn−1 received through the previous scan line 152 to transmit the initialization voltage Vint to the gate electrode G1 of the driving thin film transistor T1 and then perform an initialization operation that initializes a gate voltage Vg of the gate electrode G1 of the driving thin film transistor T1.

A gate electrode G5 of the operation control transistor T5 is connected to a light emission control line 153, a source electrode S5 of the operation control transistor T5 is connected to the driving voltage line 172, and a drain electrode D5 of the operation control transistor T5 is connected to the source electrode S1 of the driving thin film transistor T1 and the drain electrode S2 of the switching thin film transistor T2.

A gate electrode G6 of the light emission control transistor T6 is connected to a light emission control line 153, a source electrode S6 of the light emission control transistor T6 is connected to the drain electrode D1 of the driving thin film transistor T1 and the source electrode S3 of the compensation transistor T3, and a drain electrode D6 of the light emission control transistor T6 is electrically connected to an anode of the organic light emitting diode OLD.

In embodiments, the operation control transistor T5 and the light emission control transistor T6 are simultaneously turned on according to the light emission control signal EM received through the light emission control line 153, and as a result, the driving voltage ELVDD is compensated through the diode-connected driving thin film transistor T1 to be transmitted to the organic light emitting diode OLD.

A gate electrode G7 of the bypass transistor T7 is connected to the bypass control line 158, a source electrode S7 of the bypass transistor T7 is connected to the drain electrode D6 of the light emission control transistor T6 and the anode of the organic light emitting diode OLD, and a drain electrode D7 of the bypass transistor T7 is connected to the initialization voltage line and the source electrode S4 of the initialization transistor T4.

The other end Cst2 of the storage capacitor Cst is connected to the driving voltage line 172, and a cathode of the organic light emitting diode OLD is connected to a common voltage line 741 transmitting a common voltage ELVSS.

The configuration of seven transistors and one capacitor including the bypass transistor T7 has been described in the embodiment of the present invention, but the present invention is not limited thereto, and the number of transistors and the number of capacitors are modifiable in various ways.

Hereinafter, a detailed operation process of one pixel of the organic light emitting diode display according to the embodiment of the present invention will be described in detail with reference to FIG. 2.

Figure 2:
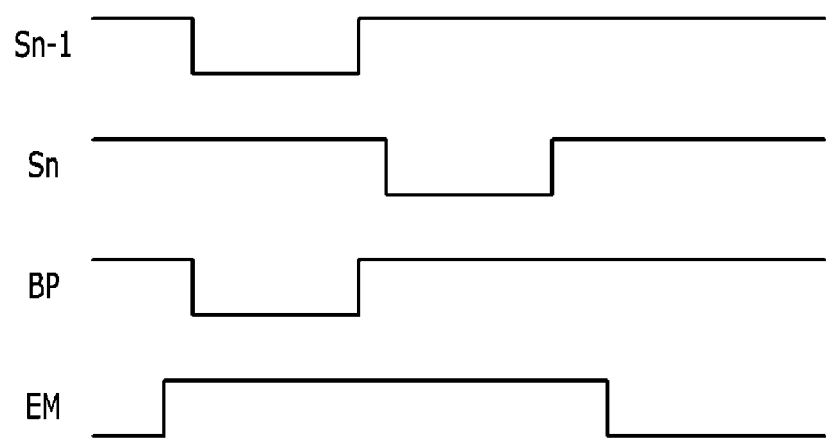
FIG. 2 is a timing diagram of a signal applied to one pixel of an organic light emitting diode display according to an embodiment of the present invention.

FIG. 2 is a timing diagram of a signal applied to one pixel of an organic light emitting diode display according to an embodiment of the present invention.

As shown in FIG. 2, first, a previous low-level scan signal Sn−1 is supplied to one pixel through the previous scan line 152 for an initialization period. Next, the initialization transistor T4 is turned on depending on the previous low-level scan signal Sn−1, the initialization voltage Vint is transmitted to the gate electrode G1 of the driving transistor T1 from the initialization voltage line 192 through the initialization transistor T4, and the driving transistor T1 is initialized by the initialization voltage Vint.

Next, the low-level scan signal Sn is supplied through the scan line 151 for a data programming period. Next, the switching transistor T2 and the compensation transistor T3 are turned on depending on the low-level scan signal Sn. In this case, the driving transistor T1 is diode-connected by the turned on compensation transistor T3 and is biased forward.

Next, a compensation voltage (Dm+Vth) (in embodiments, Vth is a negative value) which is reduced as much as a threshold voltage (Vth) of the driving transistor T1 from the data signal Dm supplied from the data line 171 is applied to the gate electrode G1 of the driving transistor T1. In embodiments, a gate voltage Vg applied to the gate electrode G1 of the driving transistor T1 is the compensation voltage (Dm+Vth).

The driving voltage (ELVDD) and the compensation voltage (Dm+Vth) are applied to opposite ends of the storage capacitor Cst, and a charge corresponding to a voltage difference between the opposite ends of the storage capacitor Cst is stored in the storage capacitor Cst.

Next, the light emission control signal EM supplied from the light emission control line 153 is changed from a high level to a low level for a light emission period. Next, the operation control transistor T5 and the light emission control transistor T6 are turned on by the low-level emission control signal EM for the light emission period.

Next, a driving current Id corresponding to a voltage difference between the gate voltage Vg of the gate electrode G1 of the driving transistor T1 and the driving voltage (ELVDD) is generated and the driving current Id is supplied to the organic light emitting diode OLD through the light emission control transistor T6. A driving gate-source voltage Vgs of the driving transistor T1 is maintained at [(Dm+Vth)−ELVDD] by the storage capacitor Cst for the light emission period, and the driving current Id is proportional to the square $[(Dm-ELVDD)^2]$ of a value obtained by subtracting the threshold voltage from the driving gate-source voltage. Accordingly, the driving current Id is determined independent of the threshold voltage Vth of the driving transistor T1.

In embodiments, the bypass transistor T7 receives a bypass signal BP from the bypass control line 158. Accordingly, some of the driving current Id flows out of the bypass transistor T7 as a bypass current Ibp.

In embodiments, when the organic light emitting diode OLD emits light even though a minimum current of the driving transistor T1 displaying a black image flows as a driving current, the black image is not substantially displayed. Accordingly, the bypass transistor T7 of the foldable display device according to the embodiment of the present invention may disperse some of the minimum current of the driving transistor T1 to other current paths other than a current path toward the organic light emitting diode as the bypass current Ibp. Here, the minimum current of the driving transistor T1 means a current under the condition that the driving gate-source voltage Vgs of the driving transistor T1 is smaller than the threshold voltage Vth, and thus the driving transistor T1 is turned off. The minimum driving current (e.g., a current which is equal to or less than 10 pA) under the condition in which the driving transistor T1 is turned off is transmitted to the organic light emitting diode OLD and is represented by an image of black luminance. When the minimum driving current for displaying the black image flows, influence of the bypass transmission of the bypass current Ibp is high, but when a high driving current for displaying an image such as a general image or a white image flows, the influence of the bypass current Ibp may be very small. Therefore, when the driving current for displaying a black image flows, a light emission current (Ioled) of the organic light emitting diode OLD reduced by a current amount of the bypass current (Ibp) flowing out of the bypass transistor T7 from the driving current (Id) has a minimum current amount that may substantially represent the black image. Contrast ratio may be improved by using the bypass transistor T7 and realizing an accurate black luminance image. Referring to FIG. 2, the bypass signal BP corresponds to the previous scan signal Sn−1, but is not limited thereto.

A detailed structure of the organic light emitting diode display shown in FIGS. 1 and 2 will now be described in detail with reference to FIGS. 3, 4, 5, and 6.

Figure 3:
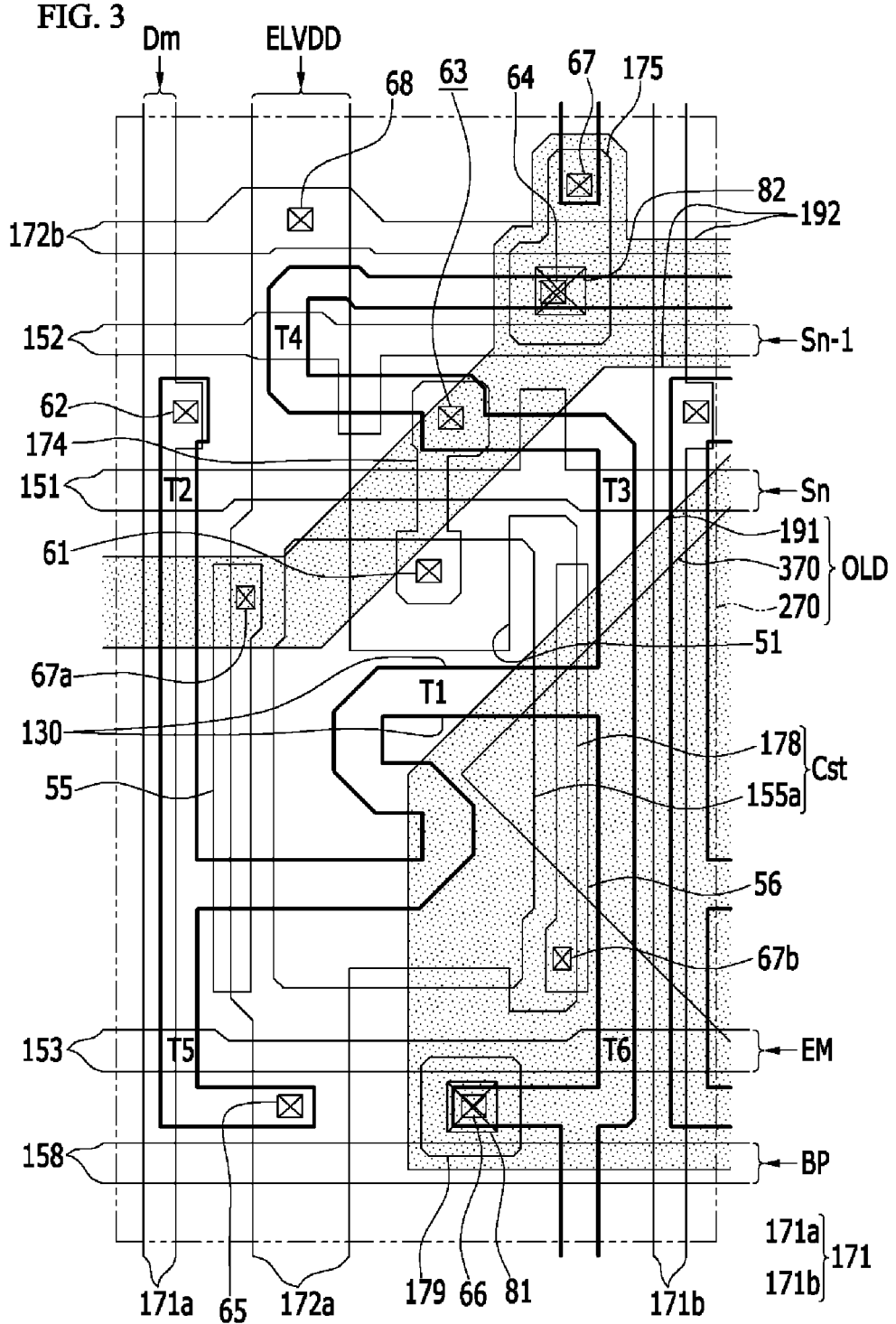
FIGS. 3 and 4 show a detailed layout of a plurality of transistors, capacitors and their connections of an organic light emitting diode display according to an embodiment of the present invention.
Figure 4:
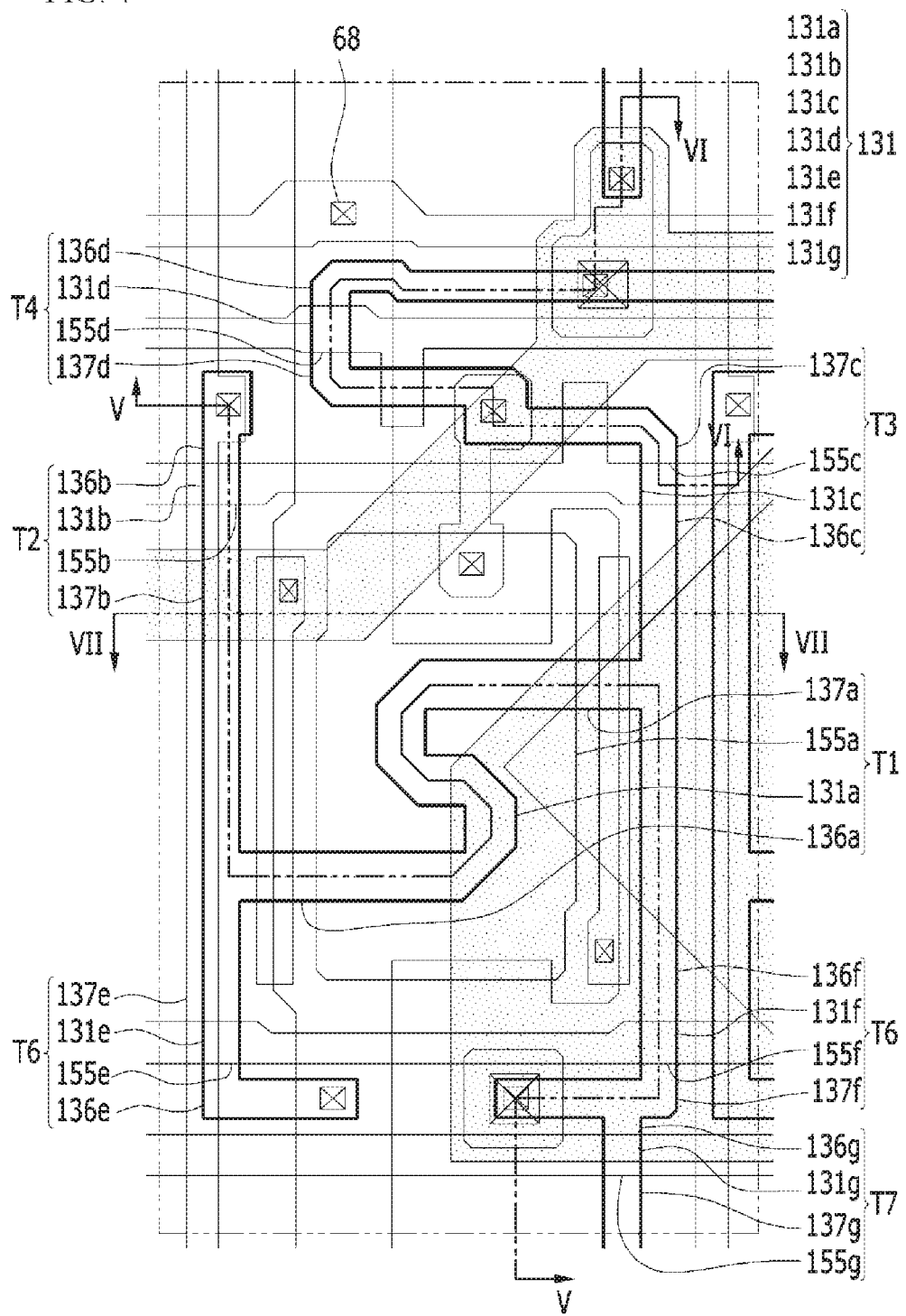
Figure 5:
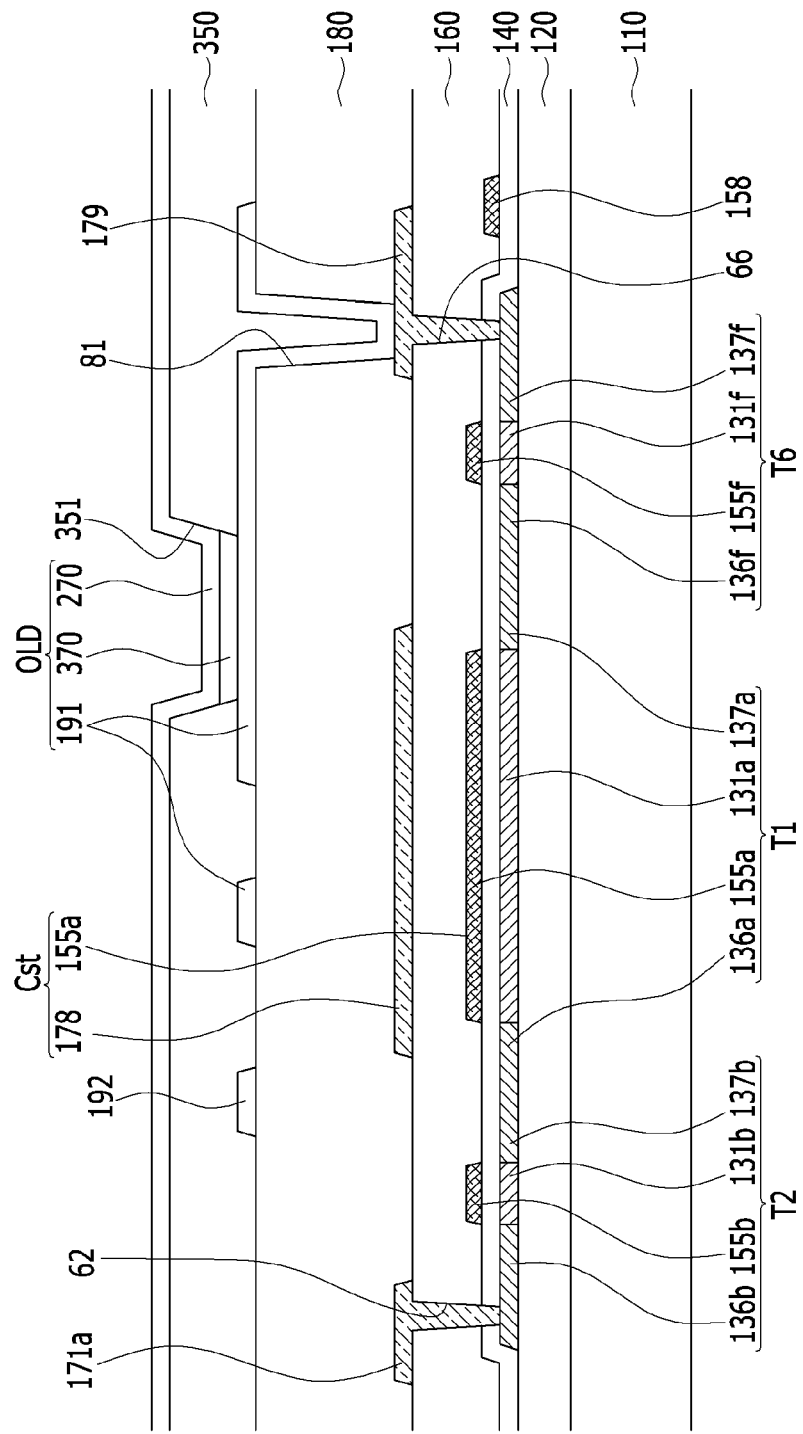
FIG. 5 is a cross-sectional view of the organic light emitting diode display of FIG. 4 taken along line V-V.
Figure 6:
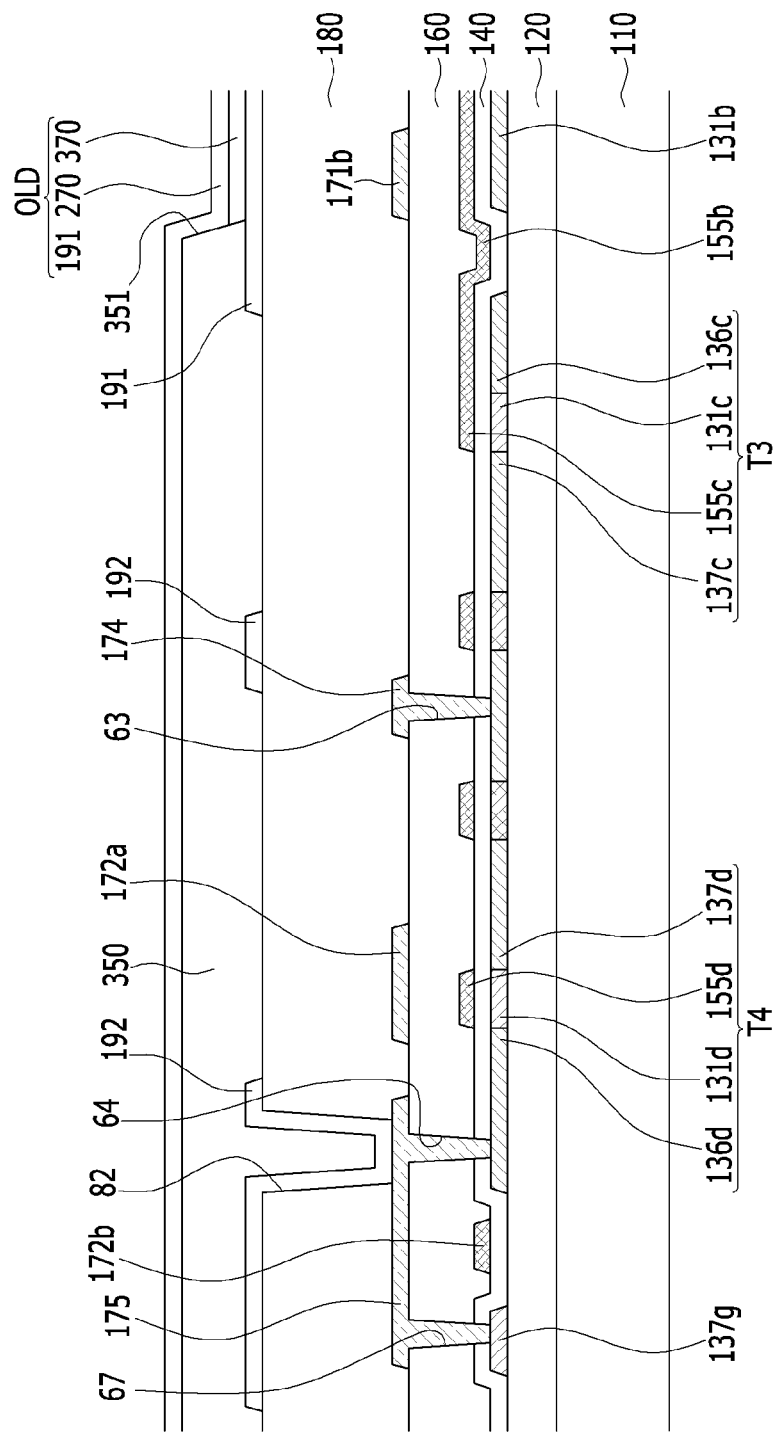
FIG. 6 is a cross-sectional view of the organic light emitting diode display of FIG. 4 taken along line VI-VI.
Figure 7:
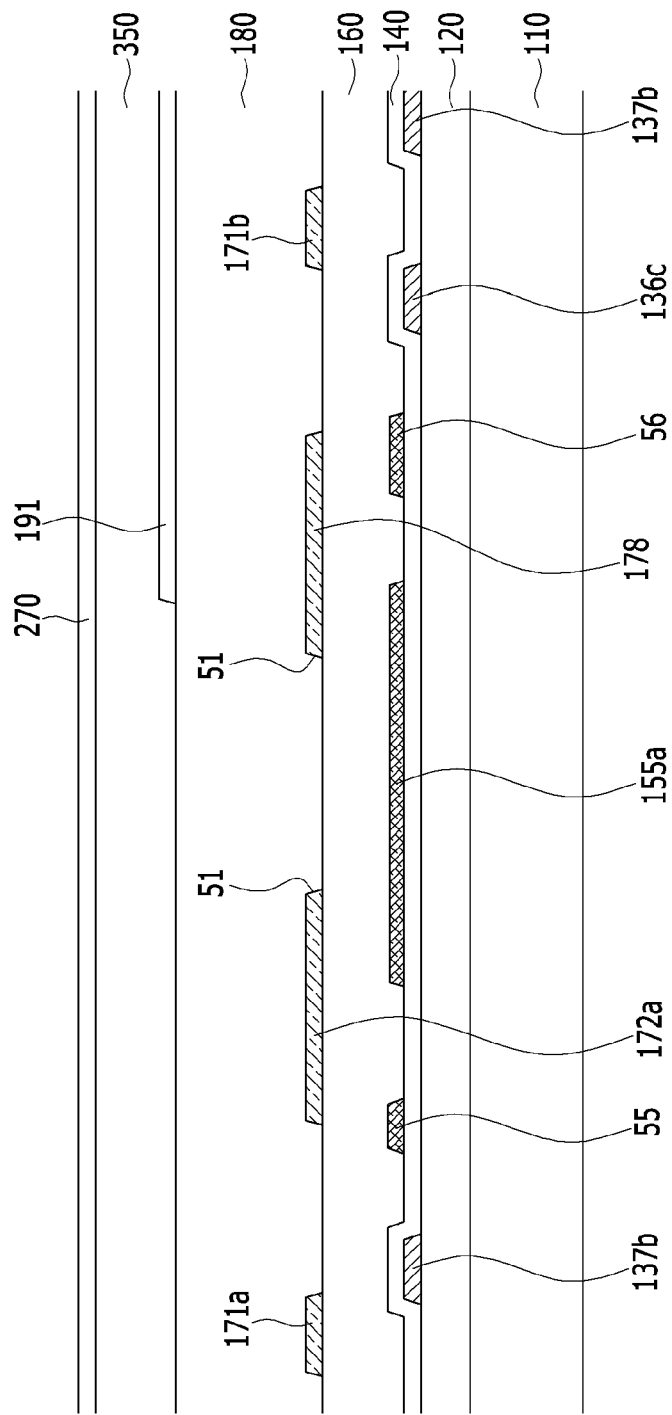
FIG. 7 is a cross-sectional view of the organic light emitting diode display of FIG. 4 taken along line VII-VII.

FIGS. 3 and 4 show a detailed layout of a plurality of transistors, capacitors and their connections of an organic light emitting diode display according to an embodiment of the present invention. FIG. 5 is a cross-sectional view of the organic light emitting diode display of FIG. 4 taken along line V-V, FIG. 6 is a cross-sectional view of the organic light emitting diode display of FIG. 4 taken along line VI-VI, and FIG. 7 is a cross-sectional view of the organic light emitting diode display of FIG. 4 taken along line VII-VII.

Hereinafter, a detailed planar structure of the organic light emitting diode display according to the embodiment of the present invention will be first described in detail with reference to FIGS. 3 and 4, and a detailed cross-sectional structure will be described in detail with reference to FIGS. 5, 6, and 7.

As shown in FIGS. 3 and 4, the organic light emitting diode display according to the embodiment of the present invention includes the scan line 151, the previous scan line 152, the light emission control line 153, and the bypass control line 158, which respectively transmit a scan signal Sn, the previous scan signal Sn−1, the light emission control signal EM, and the bypass signal BP and which are formed along a row direction. Further, the organic light emitting diode display includes the data lines 171a, 171b and the driving voltage lines 172a, 172b that cross the scan line 151, the previous scan line 152, the light emission control line 153, and the bypass control line 158, and that respectively apply the data signal Dm and the driving voltage (ELVDD) to the pixel PX. The driving voltage lines 172 includes a first driving voltage line 172a parallel to the data lines 171a and 171b and a second driving voltage line 172b parallel to the scan line 151. The first driving voltage line 172a and the second driving voltage line 172b are connected to each other through a contact hole 68.

The initialization voltage Vint is transmitted from the initialization voltage line 192 to the compensation transistor T3 via the initialization transistor T4. The initialization voltage line 192 is formed to alternately have a straight line portion and an oblique line portion.

Further, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode (OLD) are formed in the pixel PX.

Channels of the driving transistor T1, the switching transistor T2, the compensation transistor T3, the initialization transistor T4, the operation control transistor T5, the light emission control transistor T6, the bypass transistor T7 are formed inside one semiconductor 130 connected to the channels, respectively, and the semiconductor 130 may be formed to be curved in various shapes. The semiconductor 130 may be made of polysilicon or an oxide semiconductor. The oxide semiconductor may include any one of titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof. In the case in which the semiconductor 130 is formed of an oxide semiconductor, in order to protect the oxide semiconductor, which is vulnerable to an external environment such as a high temperature, a separate passivation layer may be added.

The semiconductor 130 includes a channel which is channel-doped with an N-type impurity or a P-type impurity, and a source doping area and a drain doping area which are formed at opposite sides of the channel and doped at a higher concentration than the doping impurity doped in the channel. In the embodiment, the source doping area and the drain doping area correspond to the source electrode and the drain electrode, respectively. The source electrode and the drain electrodes formed in the semiconductor 130 may be formed by doping only the corresponding areas. Further, in the semiconductor 130, there is an area between a source electrode of one transistor and a drain electrode of another transistor which neighbor and connected to each other without any other transistor. This area is doped, and thus, the source electrode and the drain electrode may be electrically connected to each other.

As shown in FIG. 4, the semiconductor 130 includes the channels 131 which include a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a is curved and may have an oblique shape or a zigzag shape. As such, by forming the curved driving channel 131a, the driving channel 131a may be formed to be elongated in a narrow space. Accordingly, a driving range of the driving gate-source voltage Vgs between the driving gate electrode 155a and the driving source electrode 136a is increased by the elongated driving channel 131a. Since the driving range of the driving gate-source voltage Vgs is increased, a gray scale of light emitted from the organic light emitting diode OLED may be precisely controlled by changing the driving gate-source voltage Vgs, and as a result, the resolution of the organic light emitting diode display device may be enhanced and display quality may be improved. Various examples such as 'reverse S', 'S', 'M', and 'W' may be implemented by variously modifying the shape of the driving channel 131a.

The driving gate electrode 155a overlaps the driving channel 131a, and the driving source electrode 136a and the driving drain electrode 137a are each formed to be respectively adjacent to opposite sides of the driving channel 131a. The driving gate electrode 155a is connected to a driving connection member 174 through a contact hole 61.

The switching transistor T2 includes the switching channel 131b, the switching gate electrode 155b, the switching source electrode 136b, and the switching drain electrode 137b. The switching gate electrode 155b that is partially extended downward from the scan line 151 overlaps the switching channel 131b, and the switching source electrode 136b and the switching drain electrode 137b are respectively formed to be adjacent to opposite sides of the switching channel 131b. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c that is a portion of the scan line 151 is formed in two in order to prevent current leakage, and it overlaps the compensation channel 131c. The compensation source electrode 136c and the compensation drain electrode 137c are respectively formed to be adjacent to opposite sides of the compensation channel 131c. The compensation drain electrode 137c is connected to a driving connection member 174 through a contact hole 63.

The initialization transistor T4 includes the initialization channel 131d, an initialization gate electrode 155d, an initialization source electrode 136d, and an initialization drain electrode 137d. The initialization gate electrode 155d that is a portion of the previous scan line 152 is formed in two in order to prevent current leakage, and it overlaps the initialization channel 131d. The initialization source electrode 136*d* and the initialization drain electrode 137*d* are respectively formed to be adjacent to opposite sides of the initialization channel 131*d*. The initialization source electrode 136*d* is connected to an initialization connecting member 175 through a contact hole 64.

The operation control transistor T5 includes the operation control channel 131*e*, an operation control gate electrode 155*e*, an operation control source electrode 136*e*, and an operation control drain electrode 137*e*. The operation control gate electrode 155*e* that is a portion of the light emission control line 153 overlaps the operation control channel 131*e*, and the operation control source electrode 136*e* and the operation control drain electrode 137*e* are respectively formed to be adjacent to opposite sides of the operation control channel 131*e*. The operation control source electrode 136*e* is connected to the driving voltage line 172 through a contact hole 65.

The light emission control transistor T6 includes the light emission channel 131*f*, a light emission gate electrode 155*f*, a light emission source electrode 136*f*, and a light emission drain electrode 137*f*. The light emission control gate electrode 155*f* that is a portion of the light emission control line 153 overlaps the light emission control channel 131*f*, and the light emission control source electrode 136*f* and the light emission control drain electrode 137*f* are respectively formed to be adjacent to opposite sides of the light emission control channel 131*f*. The light emission control drain electrode 137*f* is connected to a light emission control connecting member 179 through a contact hole 66.

The bypass transistor T7 includes the bypass channel 131*g*, a bypass gate electrode 155*g*, a bypass source electrode 136*g*, and a bypass drain electrode 137*g*. The bypass gate electrode 155*g* that is a portion of the bypass control line 158 overlaps the bypass channel 131*g*, and the bypass source electrode 136*g* and the bypass drain electrode 137*g* are respectively formed to be adjacent to opposite sides of the bypass channel 131*g*.

The bypass source electrode 136*g* is connected directly to the light emission control drain electrode 137*f* of the transistor T6, and the bypass drain electrode 137*g* is connected directly to the initialization source electrode 136*d* of the transistor T4.

One end of the driving channel 131*a* of the driving transistor T1 is connected to the switching drain electrode 137*b* and the operation control drain electrode 137*e*, and the other end of the driving channel 131*a* is connected to the compensation source electrode 136*c* of the transistor T3 and the light emission control source electrode 136*f* of the transistor T6.

The storage capacitor Cst includes a first storage electrode 155*a* and a second storage electrode 178 disposed with an interlayer insulating layer 160 therebetween. In the illustrated embodiment, the first storage electrode 155*a* and the driving gate electrode 155*a* are incorporated in a single piece which functions both the first storage electrode and the driving gage electrode, but the invention is not limited thereto. The second storage electrode 178 corresponds to an area extending from the first driving voltage line 172*a* and is respectively formed in each pixel. In embodiments, the interlayer insulating layer 160 operates as a dielectric material, and a storage capacitance is determined by a charge charged in the storage capacitor Cst and a voltage between charging plates 155*a* and 156. As described above, by using the driving gate electrode 155*a* as the first storage electrode 155*a*, a space for forming the storage capacitor may be obtained in the space that is decreased by the driving channel 131*a* occupying a large area in the pixel.

As the driving gate electrode 155*a*, the first storage electrode 155*a* is connected to one end of the driving connection member 174 through the contact hole 61. The driving connection member 174 is formed in the same layer to be substantially parallel to the data line 171, and another end of the driving connection member 174 is connected to the compensation drain electrode 137*c* of the compensation transistor T3 and the initialization drain electrode 137*d* of the initialization transistor T4 through the contact hole 63. Accordingly, the driving connecting member 174 connects the driving gate electrode 155*a* and the compensation drain electrode 137*c* of the compensation transistor T3 and the initialization drain electrode 137*d* of the initialization transistor T4 to each other. The driving connecting member 174 corresponds to a driving gate node GN in the equivalent circuit diagram of FIG. 1.

The second storage electrode 178 is an expansion extending from the first driving voltage line 172*a*. Accordingly, the storage capacitor Cst stores the storage capacitance corresponding to a difference between the driving voltage ELVDD transmitted to the second storage electrode 178 through the driving voltage line 172 and the gate voltage Vg of the driving gate electrode 155*a*. The second storage electrode 178 includes a curved portion 51 partly surrounding the contact hole 61. As shown in FIG. 3, the curved portion 51 may be disposed at a side of the second storage electrode 178. In embodiments, the curved portion 51 includes a curved edge and an edge of the line 172*a* defines a " ⊏ " or "C" shaped indent which partly surrounding the contact hole 61 while the curved edge includes a portion parallel to the data line 171*a* and a portion parallel to the scan line 151. However, the curved portion 51 is not limited thereto. In another embodiment, the curved portion or curved edge of the second storage may define a hole and completely surround the contact hole 61 when viewed in a viewing direction perpendicular to a major surface of the substrate. The shape of the curved portion or shape may also be variously modified.

The data line 171 crosses the scan line 151 and extends in a column direction, and the driving voltage line 172 is spaced apart from the data line 171 and extends in the column direction.

The organic light emitting diode OLD includes a pixel electrode 191, an organic light emission layer 370, and a common electrode 270.

The pixel electrode 191 is an anode that is a hole injection electrode, and the common electrode 270 is a cathode that is an electron injection electrode. However, the embodiment of the present invention is not limited thereto, and according to a driving method of the organic light emitting diode display, the pixel electrode 191 may be the cathode, and the common electrode 270 may be the anode.

The pixel electrode 191 may include at least one transparent conductive layer, such as, indium tin oxide (ITO), indium zinc oxide (IZO), zinc indium tin oxide (ZITO), gallium indium tin oxide (GITO), indium oxide (In2O3), zinc oxide (ZnO), gallium zinc oxide (GZO), fluorine tin oxide (FTO), and aluminum-doped zinc oxide (AZO).

The pixel electrode 191 according to the present embodiment is formed so as not to overlap the curved portion 51 of the second storage electrode 178. According to the present embodiment, the pixel electrode 191 may be formed to include an oblique line portion, a straight line portion, or a bent portion 191*a* disposed to be spaced apart from the curved portion 51, thereby not overlapping the curved portion 51. In embodiments, the pixel electrode 191 is formed so as not to overlap the curved edge of the second storage electrode 178 defining an indent partly surrounding the contact hole 61. In embodiments, the pixel electrode 191 may be formed to include an oblique line portion, a straight line portion, or a bent portion 191a disposed to be spaced apart from the curved edge, thereby not overlapping the curved portion 51.

The second storage electrode 178 extends from the first driving voltage line 172a. Further, the second storage electrode 178 includes the curved portion 51 partly surrounding the contact hole 61 for connecting the driving connection member 174 and the driving gate electrode 155a that is the first storage electrode 155a. When patterning a conductive material layer to form the curved portion, a residual layer or layers may occur or may be formed in the second storage electrode 178 adjacent to the curved portion 51 due to imbalanced etching therein. The residual layer may cause some defects, such as, disconnection of the pixel electrode 191 or short-circuit. Accordingly, electrical characteristics of the organic light emitting diode display may deteriorate.

However, in the embodiment of the present invention, the pixel electrode 191 is formed not to overlap the curved portion 51. Accordingly, even if a residual layer of the second storage electrode material is formed around the curved portion 51 due to imbalanced etching, such defects may be prevented or minimized.

Hereinafter, cross-sectional structures of the pixel unit and the peripheral unit in an organic light emitting diode display device according to an embodiment of the present invention will be described in detail according to a stacking order with reference to FIGS. 5 and 6.

In this case, since a stacked structure of the operation control transistor T5 is substantially the same as that of the light emission control transistor T6, a detailed description thereof will be omitted.

A buffer layer 120 is formed on a substrate 110. The substrate 110 may be formed as an insulating substrate made of glass, quartz, ceramic, or plastic. The buffer layer 120 may serve to improve a characteristic of polysilicon by blocking impurities from the substrate 110 during a crystallization process for forming polysilicon and to reduce stress that is applied to a semiconductor 130 formed on the buffer layer 120 by flattening the substrate 110. The buffer layer 120 may be formed of a material such as a silicon nitride (SiNx) or a silicon oxide ($SiO_2$).

The semiconductor 130 including channels 131 that includes a driving channel 131a, a switching channel 131b, a compensation channel 131c, a initialization channel 131d, an operation control channel 131e, a light emission channel 131f, and a bypass channel 131g, is formed on the buffer layer 120. A driving source electrode 136a and a driving drain electrode 137a are formed at opposite sides the driving channel 131a of the semiconductor 130, and a switching source electrode 136b and a switching drain electrode 137b are formed at opposite sides of the switching channel 131b. In addition, a compensation source electrode 136c and a compensation drain electrode 137c are formed at opposite sides of the compensation channel 131c, and an initialization source electrode 136d and an initialization drain electrode 137d are formed at opposite sides of the initialization channel 131d. Further, an operation control source electrode 136e and an operation control drain electrode 137e are formed at opposite sides of the operation control channel 131e, and a light emission control source electrode 136f and a light emission control drain electrode 137f are formed at opposite sides of the light emission control channel 131f.

Further, a bypass source electrode 136g and a bypass drain electrode 137g are formed at opposite sides of the bypass channel 131g.

In the illustrated embodiment, a gate insulating layer 140 is formed on the semiconductor 130 to cover the semiconductor 130. On the gate insulating layer 140, gate wires (151, 152, 153, 158, 155a, 55, 56) are formed. The gate wires include the scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, the bypass control line 158 including the bypass gate electrode 155g, the driving gate electrode (the first storage electrode) 155a, and shielding members 55 and 56. The gate wires (151, 152, 153, 158, 155a, 55, 56) may be formed in multiple layers, in which metal layers including any one of copper (Cu), a copper alloy, aluminum (Al), an aluminum alloy, molybdenum (Mo), and a molybdenum alloy are stacked. In embodiments, the gate wires (151, 152, 153, 158, 155a, 55, 56) may be simultaneously formed by forming a single layer of an electrically conductive material, and then, patterning the single layer.

An interlayer insulating layer 160 is formed on the gate wires (151, 152, 153, 158, 155a, 55, 56) and the gate insulating layer 140 is formed to cover them. The interlayer insulating layer 160 may be formed of a material such as a silicon nitride (SiNx) or a silicon oxide ($SiO_2$).

Contact holes (61, 62, 63, 64, 65, 66, 67, 67a, 67b, 68) are formed on the interlayer insulating layer 160. Data wires (171, 172, 174, 175, 178, 179) are formed on the interlayer insulating layer 160. The data wires include a driving voltage line 172 including the second storage electrode 178, the line 172 including the second storage electrode 178, the driving connection member 174, the initialization connecting member 175, the line 178 and the light emission connecting member 179. The data wires (171, 172, 174, 175, 178, 179) may be formed in multiple layers, in which metal layers include any one of copper (Cu), a copper alloy, an aluminum (Al), an aluminum alloy, molybdenum (Mo), and a molybdenum alloy, or may, for example, be formed in a triple layer of titanium/aluminum/titanium (Ti/Al/Ti), molybdenum/aluminum/molybdenum (Mo/Al/Mo) or molybdenum/copper/molybdenum (Mo/Cu/Mo). In embodiments, the data wires (171, 172, 174, 175, 178, 179) may be simultaneously formed by forming a single layer of an electrically conductive material, and then, patterning the single layer.

The data line 171 is connected to the switching source electrode 136b through the contact hole 62 formed in the gate insulating layer 140 and the interlayer insulating layer 160, and the first driving voltage line 172a partially expands, thereby forming the second storage electrode 178. The second storage electrode 178 is formed to include the curved portion 51 for connecting the first storage electrode 155a and the driving connection member 174.

One end of the driving connection member 174 is connected to the first storage electrode 155a through the contact hole 61 formed in the interlayer insulating layer 160, and another end of the driving connection member 174 is connected to the compensation drain electrode 137c and the initialization drain electrode 137d through the contact hole 63 formed in the gate insulating layer 140 and the interlayer insulating layer 160.

The initialization connecting member 175 is connected to the initialization source electrode 136d through the contact hole 64 formed in the gate insulating layer 140 and the interlayer insulating layer 160. The light emission connecting member 179 is connected to the light emission drain electrode 137f through the contact hole 66 formed on the gate insulating layer 140 and the interlayer insulating layer 160.

A passivation layer 180 covering the data wires (171, 172, 174, 175, 178, 179) and the interlayer insulating layer 160 is formed thereon. The passivation layer 180 covers and flattens the data wires (171, 172, 174, 175, 178, 179), thereby forming the pixel electrode 191 on the passivation layer 180 without a step. The passivation layer 180 may be made of an organic material such as a polyacrylate resin and a polyimide resin, or a stacked layer in which the organic material and an inorganic material are stacked.

A pixel electrode 191 and an initialization voltage line 192 are formed on the passivation layer 180. The light emission connecting member 179 is connected to the pixel electrode 191 through the contact hole 81 formed on the passivation layer 180, and the initialization connecting member 175 is connected to the initialization voltage line 192 through the contact hole 82 formed on the passivation layer 180. The pixel electrode 191 is formed not to overlap the curved portion 51.

Therefore, according to the embodiment of the present invention, since the pixel electrode 191 is formed not to overlap the curved portion 51, even if a residual layer is generated in the second storage electrode 178 around the curved portion 51 due to imbalanced etching, any defects of the pixel electrode 191 that would be caused by such residual layers may be avoided.

A pixel defined layer (PDL) 350 covering the passivation layer 180, the initialization voltage line 192, and the pixel electrode 191 is formed on edges of the passivation layer 180, the initialization voltage line 192, and the pixel electrode 191, and the PDL 350 has a pixel opening 351 that exposes the pixel electrode 191. The PDL 350 may be made of an organic material such as polyacrylates resin and polyimides resin, or a silica-based inorganic material.

An organic light emission layer 370 is formed on the pixel electrode 191 exposed by the pixel opening 351, and a common electrode 270 is formed on the organic light emission layer 370. The common electrode 270 is formed on the PDL 350 to be formed over the plurality of pixels. Accordingly, the organic light emitting diode OLD including the pixel electrode 191, the organic light emission layer 370, and the common electrode 270 is formed.

Here, the pixel electrode 191 is an anode which is a hole injection electrode, and the common electrode 270 is a cathode which is an electron injection electrode. However, the embodiment of the present invention is not limited thereto, and according to a driving method of the organic light emitting diode display, the pixel electrode 191 may be the cathode, while the common electrode 270 may be the anode. The hole and the electron are injected into the organic light emission layer 370 from the pixel electrode 191 and the common electrode 270, respectively, and an exciton generated by coupling the injected hole and electron falls from an excited state to a ground state to emit light.

The organic light emission layer 370 may be made of a low-molecular organic material or a high-molecular organic material such as poly 3,4-ethylenedioxythiophene (PEDOT). Further, the organic light emission layer 370 may be formed in multiple layers including a light emission layer, and one or more of a hole injection layer (HIL), a hole transporting layer (HTL), an electron transporting layer (ETL), and an electron injection layer (EIL). In the case where the organic light emission layer includes all the layers, the HIL is disposed on the pixel electrode 191 which is the anode, and the HTL, the light emitting layer, the ETL, and the EIL are sequentially stacked thereon.

The organic light emission layer 370 may include a red organic light emission layer emitting red light, a green organic light emission layer emitting green light, and a blue organic light emission layer emitting blue light. The red organic light emission layer, the green organic light emission layer, and the blue organic light emission layer are formed in a red pixel, a green pixel, and a blue pixel, respectively, thereby implementing a color image.

Further, in the organic light emission layer 370, all of the red organic light emission layer, the green organic light emission layer, and the blue organic light emission layer are together stacked on the red pixel, the green pixel, and the blue pixel, and a red color filter, a green color filter, and a blue color filter are formed for each pixel, thereby implementing the color image. As another example, white light emitting layers emitting white light are formed on all of the red pixel, the green pixel, and the blue pixel, and a red color filter, a green color filter, and a blue color filter are formed for each pixel, thereby implementing the color image. In the case of implementing the color image by using the white organic light emission layer and the color filters, it is not required to use a deposition mask for depositing the red organic light emission layer, the green organic light emission layer, and the blue organic light emission layer on respective pixels, for example, the red pixel, the green pixel, and the blue pixel.

As another example, the white organic light emission layer may be formed by one organic light emission layer, and includes a configuration formed so as to emit white light by stacking a plurality of organic light emission layers. For example, the white organic light emission layer may include a configuration which may emit white light by combining at least one yellow organic light emission layer and at least one blue light emitting layer, a configuration which may emit white light by combining at least one cyan organic light emission layer and at least one red light emitting layer, a configuration which may emit white light by combining at least one magenta organic light emission layer and at least one green light emitting layer, and the like.

An encapsulation member protecting the organic light emitting diode OLD may be formed on the common electrode 270, and the encapsulation member may be sealed on the substrate 110 by a sealant and made of various materials including glass, crystal, ceramic, plastic, and metal. Meanwhile, a thin film encapsulation layer may be formed by depositing an inorganic layer and an organic layer on the common electrode 270 without using the sealant.

Organic light emitting diode displays according to various embodiments of the present invention will now be described with reference to FIGS. 7 to 11, along with the aforementioned drawings.

FIGS. 8 to 11 are schematic diagrams of a plurality of transistors and capacitors of an organic light emitting diode display according to another embodiment of the present invention.

As shown in FIGS. 8 to 11, a storage capacitor Cst of an organic light emitting diode display according to another embodiment of the present invention includes the first storage electrode 155a and the second storage electrode 178 disposed with the interlayer insulating layer 160 therebetween. The first storage electrode 155a corresponds to the driving gate electrode 155a, and the second storage electrode 156, which extends from the first driving voltage line 172a, covers the driving gate electrode 155a while occupying an area that is wider than that of the driving gate electrode 155a. The second storage electrode 178 includes the curved portion 51 surrounding the contact hole 61 for connecting the driving gate electrode 155a corresponding to the first storage electrode 155a and the driving connection member 174.

A passivation layer 180 covering the second storage electrode 178 and the data wires (171, 172, 174, 175, 178, 179) is formed thereon. The passivation layer 180 covers and flattens the data wires (171, 172, 174, 175, 178, 179), thereby forming the pixel electrode 191 on the passivation layer 180 without a step. The passivation layer 180 may be made of an organic material such as a polyacrylate resin and a polyimide resin, or a stacked layer in which the organic material and an inorganic material are stacked.

A pixel electrode 191 and an initialization voltage line 192 are formed on the passivation layer 180. In this case, the shape of the pixel electrode 191 may be a rhombus, a rectangle, a cross-shaped dodecagon, a radial, or the like, as shown in FIGS. 8 to 11. The pixel electrode 191 partially overlaps the contact hole 66 electrically connected to the drain electrode 137f to receive a light emission control signal. As a result, the shape of the entire rim of the pixel electrode 191 may be polygonal.

Figure 8:
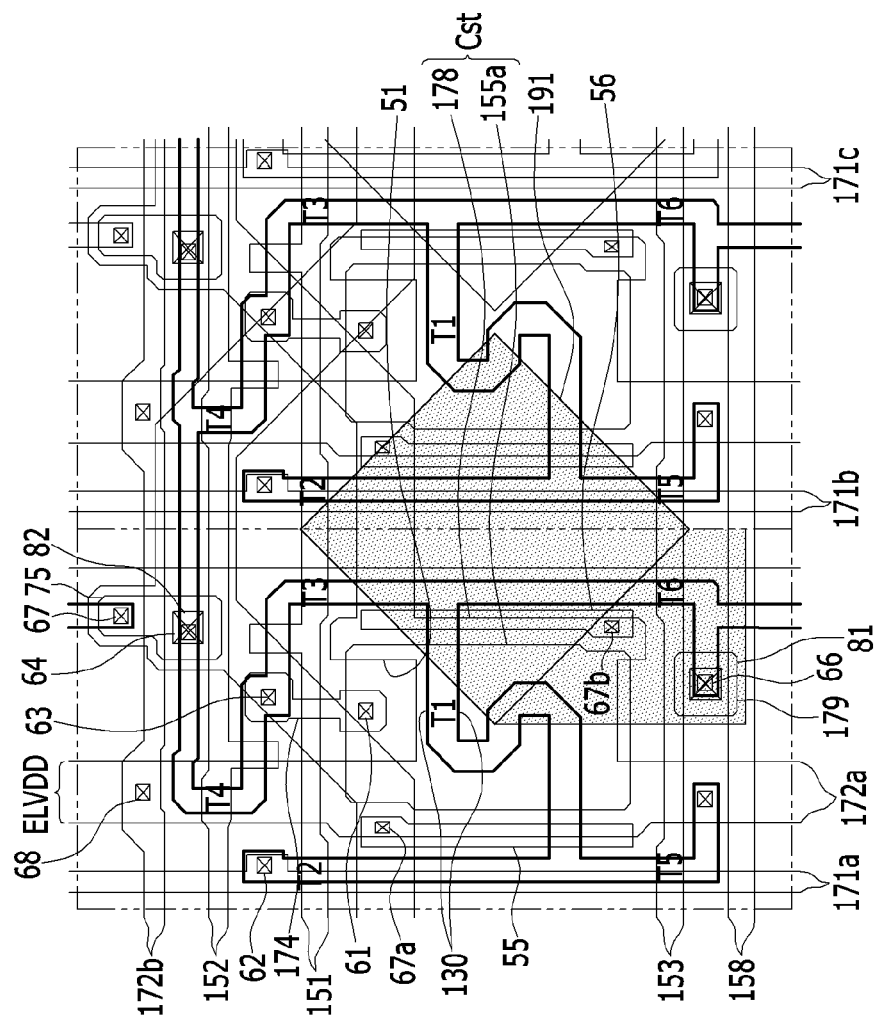
FIGS. 8 to 11 are schematic diagrams of a plurality of transistors and capacitors of an organic light emitting diode display according to another embodiment of the present invention.
Figure 9:
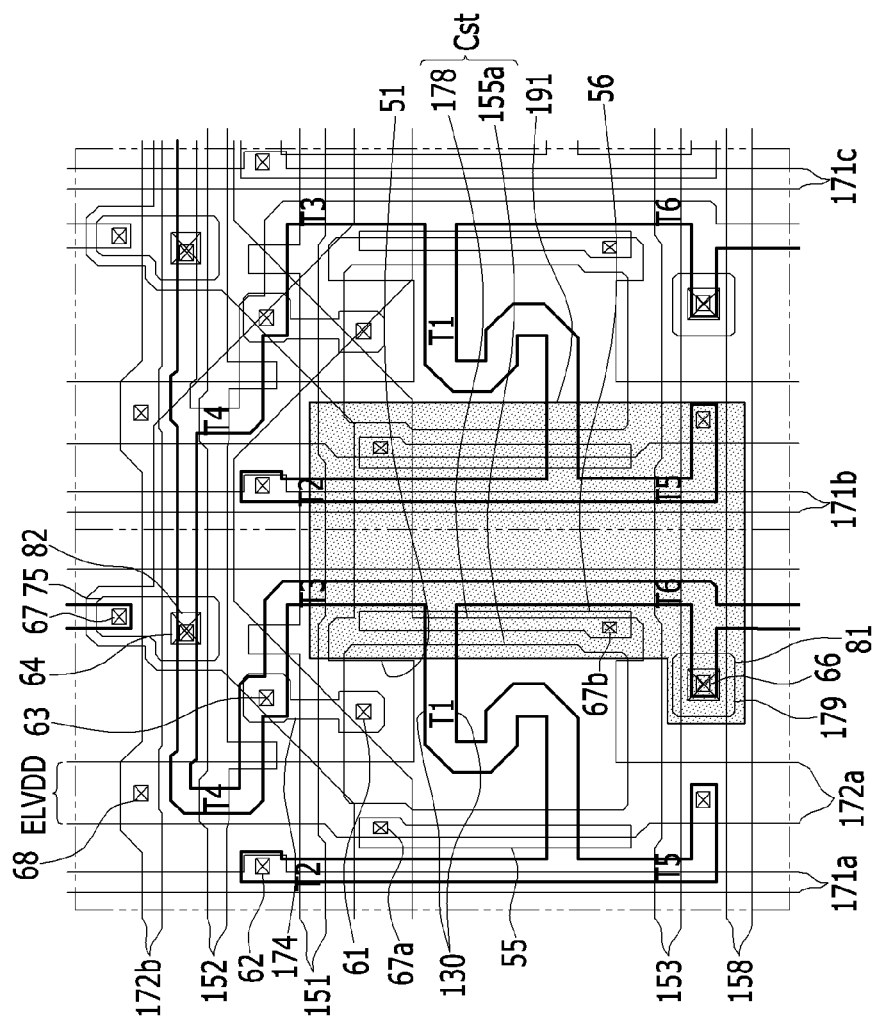
Figure 10:
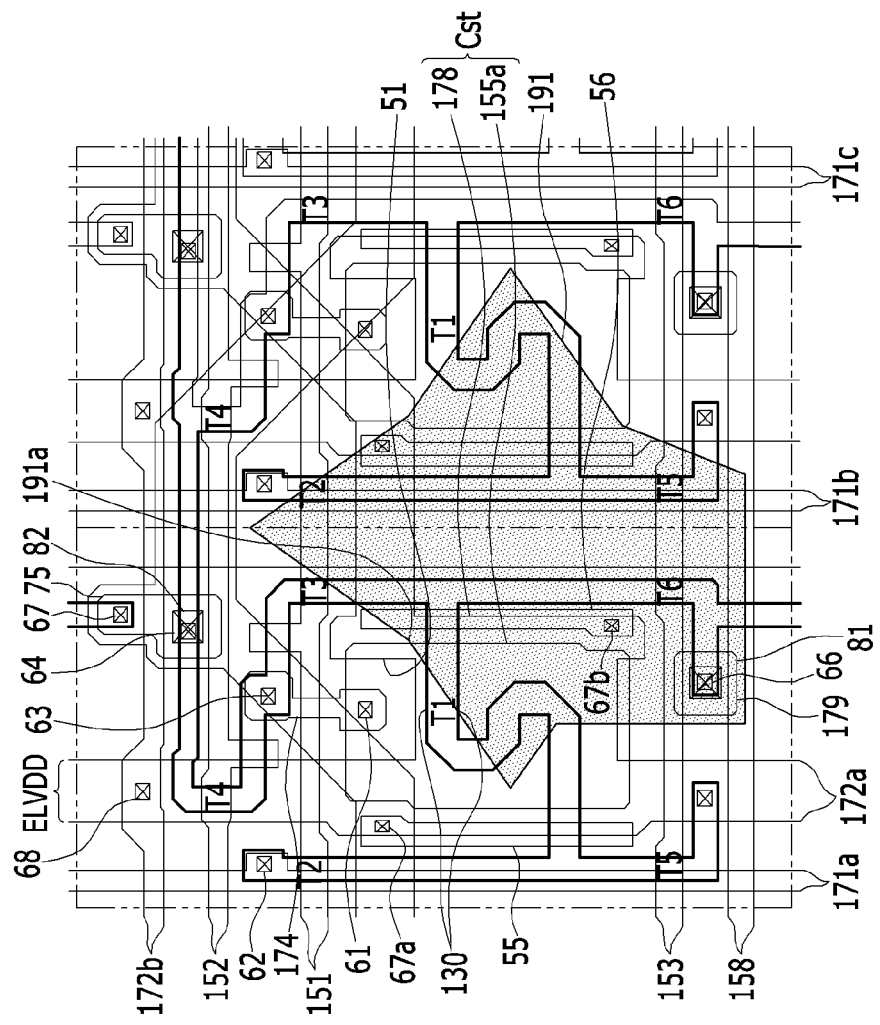
Figure 11:
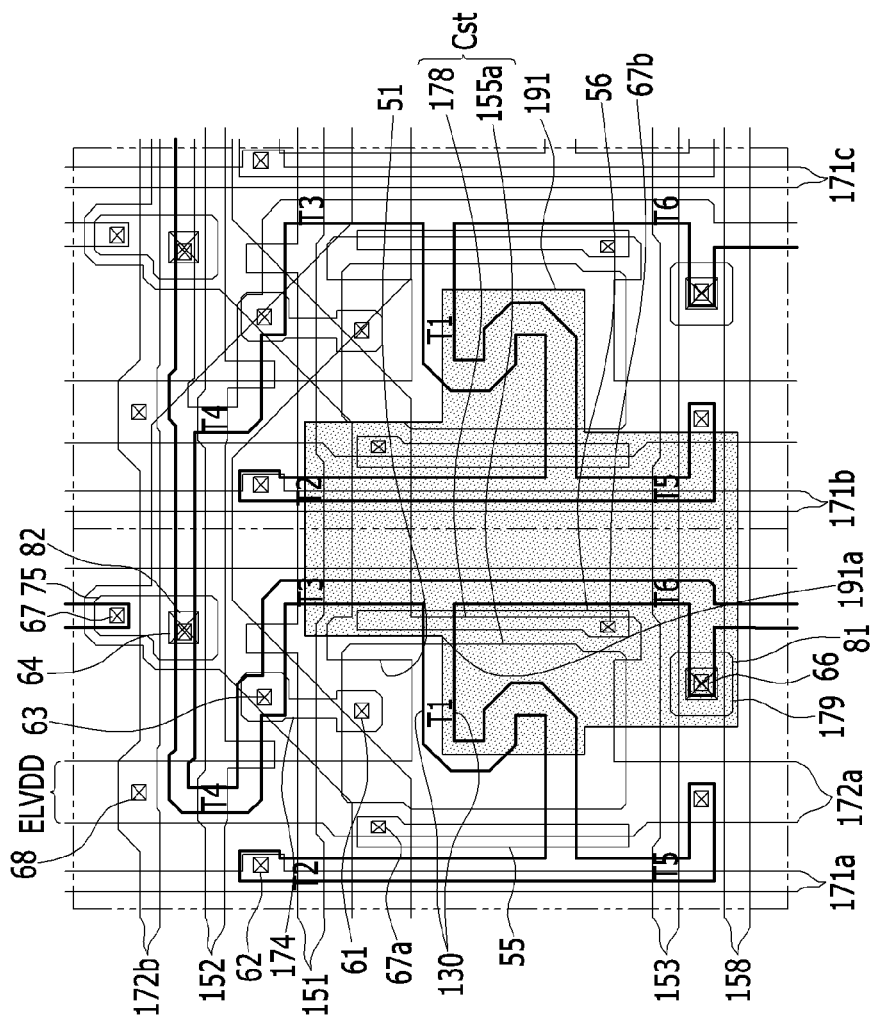

Meanwhile, in the organic light emitting diode display according to the present embodiment, the pixel electrode 191 is formed not to overlap the curved portion 51. Referring to FIGS. 8 and 9, the pixel electrode 191 may be formed to include an oblique line portion or a straight line portion disposed to be spaced apart from the curved portion 51, thereby not overlapping the curved portion 51. Further, referring to FIGS. 10 and 11, the pixel electrode 191 may be formed to include the bent portion 191a disposed to be spaced apart from the curved portion 51, thereby not overlapping the curved portion 51.

Accordingly, even if a residual layer is generated in the second storage electrode 178 around the curved portion 51 due to imbalanced etching, the pixel electrode 191 is formed not to overlap the curved portion 51, thereby preventing the disconnection.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display device comprising:
    a substrate;
    a scan line formed over the substrate and configured to transmit a scan signal;
    a data line crossing the scan line configured to transmit a data voltage;
    a driving voltage line crossing the scan line when viewed in a viewing direction and configured to transmit a driving voltage;
    a switching transistor connected to the scan line and the data line;
    a driving transistor connected to the switching transistor;
    a driving connector member connected to a driving gate electrode of the driving transistor;
    a storage capacitor comprising a first storage electrode and a second storage electrode;
    a pixel electrode electrically connected to the driving transistor; and
    a contact hole connecting the first storage electrode and the driving connector member,
    wherein, when viewed in the viewing direction, the second storage electrode comprises a curved edge at least partly surrounding the contact hole, wherein the pixel electrode is formed not to overlap the curved edge when viewed in the viewing direction,
    wherein the first storage electrode corresponds to the driving gate electrode, and wherein the second storage electrode is formed by expanding from the driving voltage line.

2. The device of claim 1, wherein the curved edge comprises a first portion that is parallel to the data line and a second portion that is parallel to the scan line.

3. The device of claim 1, further comprising:
    a light emission control line formed over the substrate and configured to transmit a light emission control signal; and
    a light emission control transistor connected to the driving transistor.

4. The device of claim 3, wherein the light emission control transistor comprises a light emission channel, a light emission gate electrode, a light emission source electrode, and a light emission drain electrode.

5. The device of claim 4, further comprising a light emission connector member electrically connected to the light emission drain electrode,
    wherein the pixel electrode is electrically connected to the light emission connector member.

6. The device of claim 5, wherein the pixel electrode overlaps another contact hole electrically connected to the light emission connecting member, and has a generally polygonal shape.

7. The device of claim 1, further comprising:
    an organic light emission layer formed over the pixel electrode, and
    a common electrode formed over the organic light emission layer.

8. The device of claim 7, further comprising an initialization voltage line formed in the same layer as the pixel electrode and configured to transmit an initialization voltage initializing the driving transistor.

9. The device of claim 1, wherein the device comprises a plurality of pixels and a plurality of pixel driving circuits, each of which is connected to one of the plurality of pixels,
    wherein each pixel driving circuit comprises the switching transistor, the driving transistor, the driving connector member, and the storage capacitor.

10. An organic light emitting diode display device comprising:
    a substrate;
    a scan line formed over the substrate and configured to transmit a scan signal;
    a data line crossing the scan line configured to transmit a data voltage;
    a driving voltage line crossing the scan line when viewed in a viewing direction and configured to transmit a driving voltage;
    a switching transistor connected to the scan line and the data line;
    a driving transistor connected to the switching transistor;
    a driving connector member connected to a driving gate electrode of the driving transistor;
    a storage capacitor comprising a first storage electrode and a second storage electrode;

a pixel electrode electrically connected to the driving transistor; and a contact hole connecting the first storage electrode and the driving connector member, wherein, when viewed in the viewing direction, the second storage electrode comprises a curved edge at least partly surrounding the contact hole, wherein the pixel electrode is formed not to overlap the curved edge when viewed in the viewing direction, and wherein the first storage electrode and the driving gate electrode are integrated in a single piece which overlaps the second storage electrode.

11. An organic light emitting diode display device comprising:

a substrate;

a scan line formed over the substrate and configured to transmit a scan signal;

a data line crossing the scan line configured to transmit a data voltage;

a driving voltage line crossing the scan line when viewed in a viewing direction and configured to transmit a driving voltage;

a switching transistor connected to the scan line and the data line;

a driving transistor connected to the switching transistor;

a driving connector member connected to a driving gate electrode of the driving transistor;

a storage capacitor comprising a first storage electrode and a second storage electrode;

a pixel electrode electrically connected to the driving transistor; and a contact hole connecting the first storage electrode and the driving connector member, wherein, when viewed in the viewing direction, the second storage electrode comprises a curved edge at least partly surrounding the contact hole, wherein the pixel electrode is formed not to overlap the curved edge when viewed in the viewing direction, and wherein the second storage electrode extends from the driving voltage line and is formed of a material the same as that of the driving voltage line.

12. The device of claim 11, wherein an edge of the driving voltage line and the curved edge of the second storage electrode collectively define an indent.

13. The device of claim 12, wherein the pixel electrode overlaps the second storage electrode, but does not overlap the indent when viewed in the viewing direction.

14. The device of claim 13, further comprising a light emission layer, wherein the light emission layer overlaps the second storage electrode, but does not overlap the indent when viewed in the viewing direction.

* * * * *